United States Patent
Fukuda et al.

(10) Patent No.: US 8,736,311 B2
(45) Date of Patent: May 27, 2014

(54) SEMICONDUCTOR INTEGRATED CIRCUIT

(71) Applicant: Kabushiki Kaisha Toshiba, Minato-ku (JP)

(72) Inventors: Ryo Fukuda, Kanagawa-ken (JP); Masaru Koyanagi, Tokyo (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/788,476

(22) Filed: Mar. 7, 2013

(65) Prior Publication Data
US 2013/0181764 A1 Jul. 18, 2013

Related U.S. Application Data

(62) Division of application No. 13/098,752, filed on May 2, 2011, now Pat. No. 8,405,428.

(30) Foreign Application Priority Data

Jun. 14, 2010 (JP) .................................. 2010-134823

(51) Int. Cl.
*H03K 5/22* (2006.01)
(52) U.S. Cl.
USPC .................. 327/77; 327/85; 327/87; 327/108
(58) Field of Classification Search
USPC .......... 327/77, 78, 85, 87, 108, 205, 206, 560
See application file for complete search history.

(56) References Cited

U.S. PATENT DOCUMENTS 8,258,817 B2 * 9/2012 Fukuda et al. .................. 327/77
8,405,428 B2 * 3/2013 Fukuda et al. .................. 327/77

FOREIGN PATENT DOCUMENTS

JP 2003-8423 1/2003

OTHER PUBLICATIONS

Yasuhiro Takai, et al., "A 250-Mb/s/pin, 1-Gb Double-Data-Rate SDRAM with a Bidirectional Delay and an Interbank Shared Redundancy Scheme", IEEE Journal of Solid-State Circuits, vol. 35, No. 2, Feb. 2000, pp. 149-162.

* cited by examiner

*Primary Examiner* — Long Nguyen
(74) *Attorney, Agent, or Firm* — Oblon, Spivak, McClelland, Maier & Neustadt, L.L.P.

(57) ABSTRACT

A constant current source circuit includes one end connected to a second node as sources of third and fourth transistors, and the other end connected to a second power supply node that supplies a second voltage different from a first voltage. The clamp circuit is configured to form a current path between the second node and the second power supply node. It adjusts the potential of the second node to a certain potential when a first external input signal is switched from a first state to a second state.

9 Claims, 9 Drawing Sheets

SEMICONDUCTOR INTEGRATED CIRCUIT

CROSS REFERENCE TO RELATED APPLICATIONS

This application is a division of and claims the benefit of priority under 35 U.S.C. §120 from U.S. Ser. No. 13/098,752, filed May 2, 2011, and claims the benefit of priority under 35 U.S.C. §119 from prior Japanese Patent Application No. 2010-134823, filed on Jun. 14, 2010, the entire contents of which are incorporated herein by reference.

FIELD

Embodiments described herein relate to a semiconductor integrated circuit.

BACKGROUND

In general, a semiconductor integrated circuit is provided with an input signal reception circuit. An input signal reception circuit changes a state of an output signal depending on a change in level of an input signal of minute amplitude that is given from outside (an external input signal). In general, a differential amplifier is used as such an input signal reception circuit for detecting a change in level of the external input signal.

A differential amplifier generally has two input terminals. Methods for detecting whether an input signal provided to a differential amplifier has reached a certain level are roughly divided into two types.

In a first method, one of the two input terminals is provided with an external input signal IN, while the other is provided with an inverted signal /IN of the external input signal IN, whereby the magnitudes of these two signals are compared.

In a second method, a reference voltage (a reference signal) VREF having a fixed value is compared with an external input signal IN.

In the first method, circuitry characteristics such as an operation speed of the circuit can be improved, for example. However, an area of the circuit increases, and a power consumption thereof also increases.

In contrast, the second method uses only half of the wirings for the input signal of the first method. The second method therefore allows the area of the circuit to be reduced and also allows power consumption to be suppressed. However, the second method compares the output signal from outside with the reference voltage having a fixed value. Thus, due to asymmetry in the current mirror circuit, one of either the rising edge or the falling edge of the output signal has a blunted waveform with respect to the other, whereby a difference in transition time inevitably occurs. Then, even in an input signal reception circuit using the second method, symmetry between the rising edge and the falling edge of the output signal is maintained, and the difference in transition time is shortened as much as possible.

DETAILED DESCRIPTION

Embodiments of the present invention will be described hereinafter in detail with reference to the accompanying drawings.

[First Embodiment]

Figure 1:
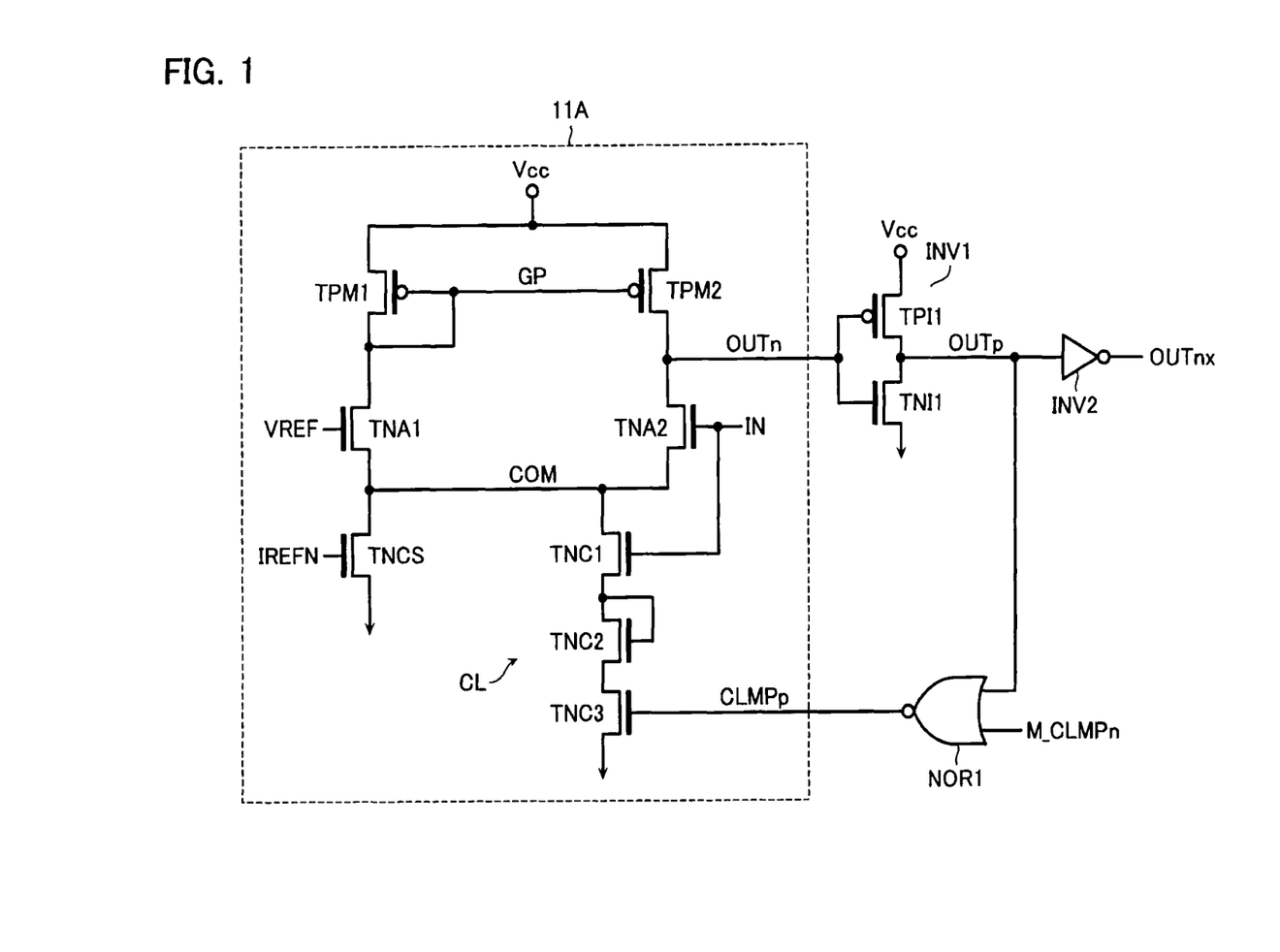
FIG. 1 is an equivalent circuit diagram of a semiconductor integrated circuit according to the first embodiment.

FIG. 1 illustrates an external input signal reception circuit including a current-mirror-type differential amplifier circuit according to the first embodiment. This external input signal reception circuit comprises a current-mirror-type differential amplifier circuit 11A, inverters INV1 and INV2, and a NOR gate NOR1.

The current-mirror-type differential amplifier circuit 11A receives an input signal IN (a first external input signal) that is an external input signal input from outside as an input signal, and compares this input signal IN with a reference voltage VREF (a second external input signal) having a fixed value. The differentially-amplified signal as a result of the comparison is output to outside as an output signal OUTn.

The inverter INV1 outputs an output signal OUTp as a reversed signal of the output signal OUTn. The inverter INV2 outputs an output signal Outnx by further reversing the output signal OUTp. The NOR gate NOR1 receives the output signal OUTp and a control signal M_CLMPn as input signals provided thereto. The NOR gate NOR1 outputs, based on these two input signals, an output signal CLMPp as an EX-OR signal of these input signals.

The current-mirror-type differential amplifier circuit 11A has PMOS transistors TPM1 and TPM2, NMOS transistors TNA1 and TNA2, an NMOS transistor TNCS, and NMOS transistors TNC1, TNC2 and TNC3. The PMOS transistors TPM1 and TPM2 are current-mirror connected, and together form a current mirror circuit. That is, the PMOS transistor TPM1 has a source connected to a power source voltage node (a first voltage node) supplied with the power source voltage Vcc. Also, the drain of the PMOS transistor TPM1 is short-circuited to the gate thereof. Accordingly, the PMOS transistor TPM1 has a diode-connected state.

Also, the PMOS transistor TPM2 has a source provided with the power source voltage Vcc. Its gate is connected to a gate of the PMOS transistor TPM1 at a node GP.

The NMOS transistors TNA1 and TNA2 have the same size, and together configure a differential pair. The drain of the NMOS transistor TNA1 is connected to the drain of the PMOS transistor TPM1. In addition, an external input signal or a reference voltage VREF with a fixed value is provided to the gate of the NMOS transistor TNA1.

On the other hand, the drain of NMOS transistor TNA2 is connected to the drain of the PMOS transistor TPM2. Also, an external input signal or the input signal IN is input into the gate of the NMOS transistor TNA2. The NMOS transistor TNA1 and NMOS transistor TNA2 are connected to each other at their gates defined as a node COM. Although it is different from the above, the reference voltage VREF may be provided to the gate of the NMOS transistor TNA2, while the input signal IN is provided to the gate of the NMOS transistor TNA1.

Note that a connection node between the NMOS transistor TNA2 and the PMOS transistor TPM2 is determined as an output node of the output signal OUTn of the current-mirror-type differential amplifier circuit 11A.

The NMOS transistor TNCS is a transistor functioning as a constant current circuit which allows a constant current to flow in the differential amplifier circuit 11A. The NMOS transistor TNCS has its drain connected to the node COM, and its source connected to a ground. The NMOS transistor TNCS has a gate provided with a control voltage IREFN such that a current flowing in the current-mirror-type differential amplifier circuit 11A is limited to a certain value.

Also, the NMOS transistors TNC1, TNC2 and TNC3 are connected in series between the node COM and a ground terminal, such that they form a current path between the node COM and the ground terminal. These NMOS transistors TNC1, TNC2 and TNC3 function as a clamping circuit CL that limits (adjusts) the potential of the node COM to a certain level when the input signal IN rises from "L" to "H".

The NMOS transistor TNC1 has a drain connected to the node COM, and a gate supplied with the external input signal IN. The NMOS transistor TNC2 is a diode-connected transistor having a drain and a gate short-circuited to each other.

The drain and the gate of the NMOS transistor TNC2 are connected to the source of the NMOS transistor TNC1. As will be mentioned below, the NMOS transistor TNC1 becomes conductive, when the input signal IN rises from "L" to "H" and a potential of the node COM rises to a certain level or more, thereby lowering the potential of the node N1. In contrast, the NMOS transistor TNC1 keeps a non-conductive state when the potential of the node COM is less than a certain level.

The NMOS transistor TNC3 has its drain connected to the source of the NMOS transistor TNC2, and its source connected to a ground terminal. Its gate is supplied with a control signal CLMPp from the NOR gate NOR1.

The NMOS transistors TNC1 and TNC3 are configured to turn on only during a period when the external input signal IN changes from "L" to "H". This is because an operation of adjusting the voltage of the node COM by the transistor TNC2 needs to be achieved only in a certain period when the external input signal IN changes from "L" to "H".

If the transistor TNC2 always functions to control the voltage level of the node COM, it may rather prevent the current-mirror-type difference amplifier circuit 11A from working properly. Accordingly, providing such transistors TNC1 and TNC3 and controlling these transistors as described above may be preferable.

The inverter INV1 is configured by a PMOS transistor TPI1 and an NMOS transistor TNI1. These two transistors are serially-connected between a power source terminal of the power source voltage Vcc and a ground terminal. These two transistors have gates commonly connected to each other. These gates configure an input terminal of the inverter INV1. This input terminal is provided with the output signal OUTn of the differential amplifier circuit 11A. The PMOS transistor TPI1 and the NMOS transistor TNI1 have drains commonly connected to each other. These drains serve as an output terminal of the inverter INV1. An output signal provided from the output terminal is defined as an output signal OUTp.

The inverter INV2 inverts the output signal OUTp provided from the inverter INV1, and outputs an output signal OUTnx that is a reversed signal of the output signal OUTp.

The NOR gate NOR1 is provided with the output signal OUTp and the control signal M_CLMPn, and outputs an output signal CLMPp that is an EX-OR signal of these input signals.

Figure 2:
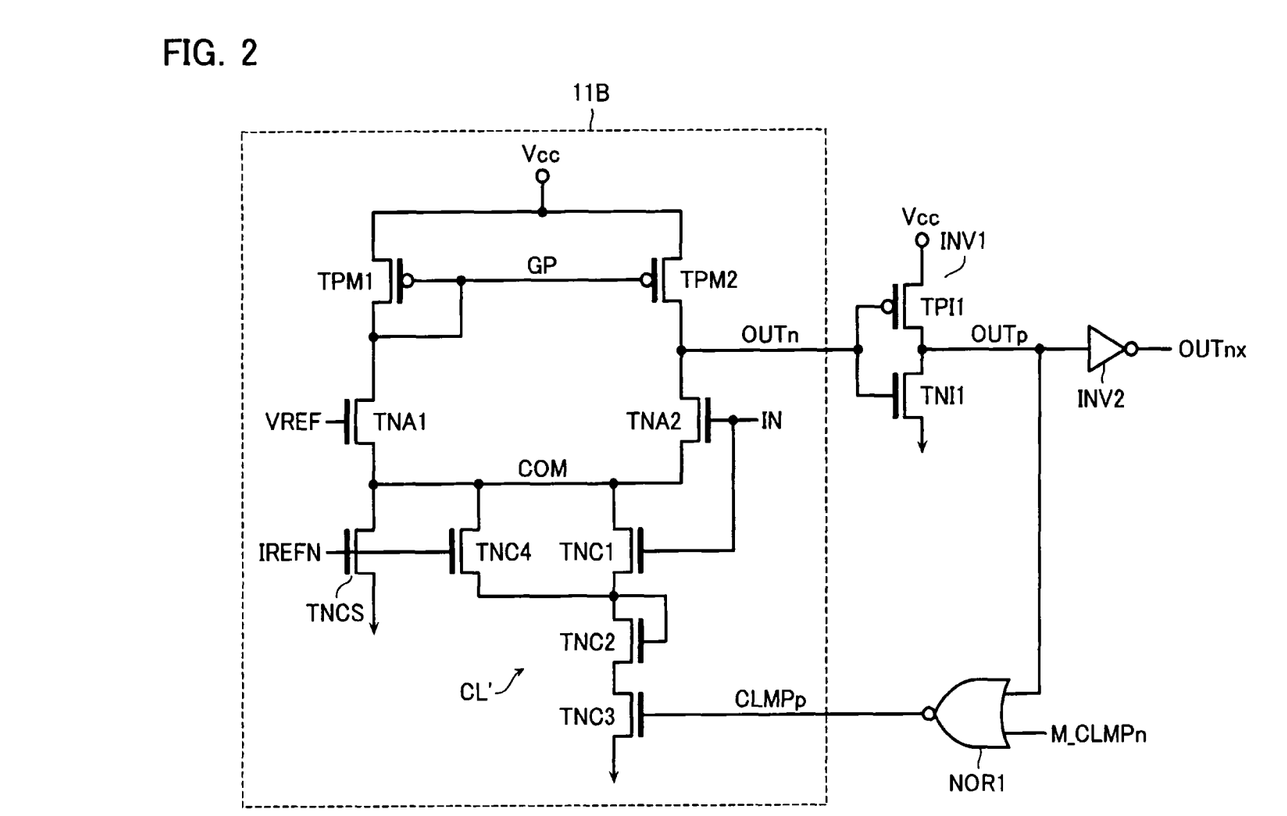
FIG. 2 is an equivalent circuit diagram of a semiconductor integrated circuit according to a modification of the first embodiment.

FIG. 2 illustrates a modification of the first embodiment. A current-mirror-type differential amplifier circuit 11B according to the modification comprises an NMOS transistor TNC4 which is connected in parallel with the NMOS transistor TNC1 (i.e., a current path is formed between the node COM and the source of the NMOS transistor TNC1). This NMOS transistor TNC4 is provided with the above-mentioned signal IREFN at its gate, and functions as a constant current circuit. When the NMOS transistors TNC1 and TNC3 are in a non-conductive state, the NMOS transistor TNC4 has a function of preventing the gate and the drain of the NMOS transistor TNC2 from shifting to a floating state.

Figure 3:
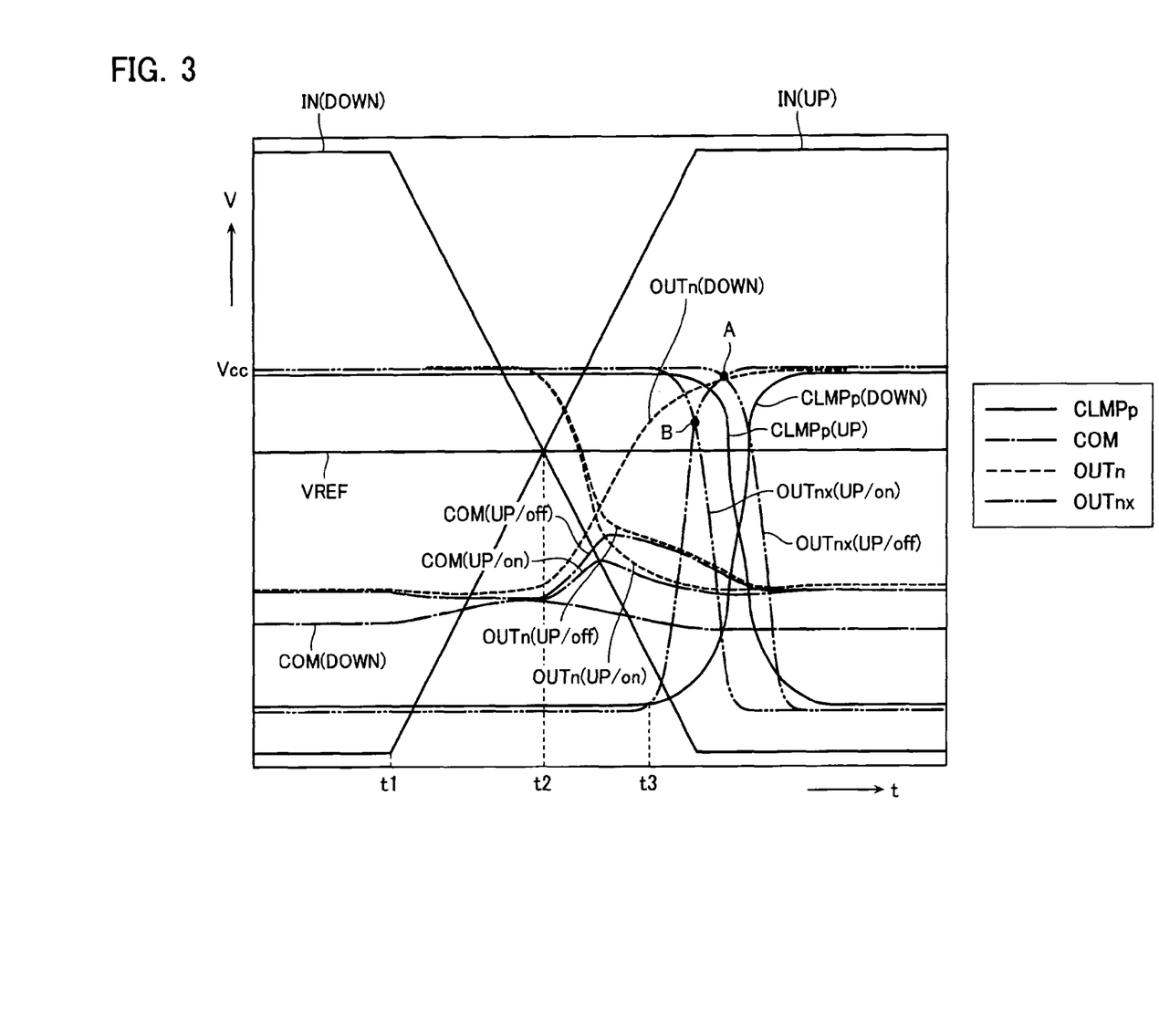
FIG. 3 is a graph showing an operation of a semiconductor integrated circuit according to the first embodiment.

Next, the operation of the semiconductor integrated circuit according to the first embodiment is described with reference to a graph shown in FIG. 3. The graph shown in FIG. 3 illustrates two cases in an overlapping manner: the case where the input signal IN varies from "H" to "L"; and conversely, the case where the input signal IN varies from "L" to "H". FIG. 3 distinguishes the two cases by adding an additional character "DOWN" to curves of various voltages in the former case, and "UP" to curves of various voltages in the latter case. In addition, in order to show the advantage of the clamping circuit CL comprising NMOS transistors TNC1 to TNC3, FIG. 3 illustrates in the graph not only the operation when the clamping circuit CL is used (the control signal M_CLMPn="H"), but also the operation when the clamping circuit CL is not in use (the control signal M_CLMPn="L").

First, the operation when the input signal IN drops to "L" from "H" is described (IN(DOWN) shown in FIG. 3). The input signal IN starts a drop to "L" from "H" at time t1, and then a voltage value of the input signal IN becomes smaller than a voltage value of the reference voltage VREF at time t2. Then, a current flowing through the NMOS transistor TNA1 becomes larger than a current flowing through the NMOS transistor TNA2. As a result, the output voltage OUTn (curve OUTn(DOWN) shown in FIG. 3) starts a rise towards the power source voltage Vcc from substantially the same value as the voltage of the node COM. The output voltage OUTnx also starts a rise towards the power source voltage Vcc from 0 V at around time t3 slightly later than the output voltage OUTn. On the other hand, the voltage of the node COM has a voltage value of high level (for example, about 0.9 V) before time t1, but decreases from around time t2, falling to low level (for example, about 0.6 V).

Note that the clamping circuit CL configured by the NMOS transistors TNC1-TN3 does not function while the input signal IN is "L" after dropping from "H", irrespective of the state of the control signal M_CLMPn. That is, until around time t2, the state of the output signal OUTp is "H". Accordingly, the NMOS transistor TNC3 is set to a non-conductive state (OFF). Therefore, the voltage of the node COM is not controlled by the clamping circuit CL, even if the control signal M_CLMPn="L". Subsequently, the output signal OUTn rises towards "H", and the output signal OUTp falls towards "L", whereby the NMOS transistor TNC3 attains the conductive state (ON). However, around that time, the input signal IN falls to "L", whereby the NMOS transistor TNC1 attains the non-conductive state (OFF). Therefore, the voltage of the node COM is not controlled by the clamping circuit CL. Thus, the clamping circuit CL does not function while the input signal IN drops from "H" to "L" irrespective of the state of the control signal M_CLMPn.

Next, operation when the input signal IN rises from "L" to "H" (IN(UP) shown in FIG. 3) is described.

When the input signal IN starts a rise towards "H" from "L" at time t1, the NMOS transistor TNA2 shifts to the conductive state (ON), and, hence, after time t2, the output voltage OUTn also starts a drop towards the voltage of the node COM from the power source voltage Vcc. On the other hand, the shifting of the NMOS transistor TNA2 to the conductive state causes the potential of the node COM to rise from low level (for example, about 0.6 V) to high level (for example, about 0.9 V).

However, due to the fact that the rise speed of the input signal IN is too fast for the current supply capacity of the NMOS transistor TNCS to keep up, the potential of the node COM rises, temporarily (from time t2), even higher than the anticipated high level (for example, about 0.9 V). In order to suppress this temporary rise in potential of the node COM, the present embodiment operates the clamping circuit CL while the input signal IN is rising from "L" to "H".

The curve of the node COM when the clamping circuit CL is not operated is represented in FIG. 3 by label COM(UP/off). If the width of the temporary rise in potential of the node COM is large as in FIG. 3, the fall in the output voltage OUTn is also delayed to an according degree, and timing of the change in the output voltage OUTnx is also delayed (label OUTnx(UP/off) shown in FIG. 3).

Operating the clamping circuit CL allows the rise width of the potential of the node COM to be suppressed as in the curve indicated by label COM(UP/on). Specifically, when the input signal IN rises from "L" to "H" at time t1, the NMOS transistor TNC1 attains the conductive state (ON). At this time, the transistor TNC3 is already in the conductive state. Therefore, when the potential of the node COM temporarily rises, the diode-connected transistor TNC2 changes to the conductive state (ON), whereby the potential of the node COM can be lowered (curve COM(UP/on) of FIG. 3). The timing of the fall in the output voltage OUTn can be accelerated to an according degree, and timing of the change in the output voltage OUTnx can be accelerated (label OUTnx(UP/on) of FIG. 3).

It is preferable that the output signal OUTnx(DOWN) when the input signal IN switches from "H" to "L" and the output signal OUTnx(UP) when the input signal IN switches from "L" intersect at a position of Vcc/2. As the point of intersection of the two curves becomes more distant from the position of Vcc/2, the difference between the transition time of the output signal OUTnx(DOWN) and the transition time of the output signal OUTnx(UP) becomes larger. When the clamping circuit CL is not operated, the point of intersection of the two curves becomes point A near to Vcc (FIG. 3). However, if the clamping circuit CL is operated, this point of intersection can be set to point B, whereby asymmetry between the output signal OUTnx and the input signal IN at its rise time and its fall time can be suppressed, and the difference in transition times can be shortened.

Note that in the above description, a configuration where the clamping circuit CL is provided with a diode-connected NMOS transistor TNC2 is described. However, provided that the clamping circuit CL can function to adjust the potential of the node COM when the input signal IN is switched from "L" to "H", the diode-connected NMOS transistor TNC2 may be omitted, or there may be a resistance inserted in its place.

[Second Embodiment]

Figure 4:
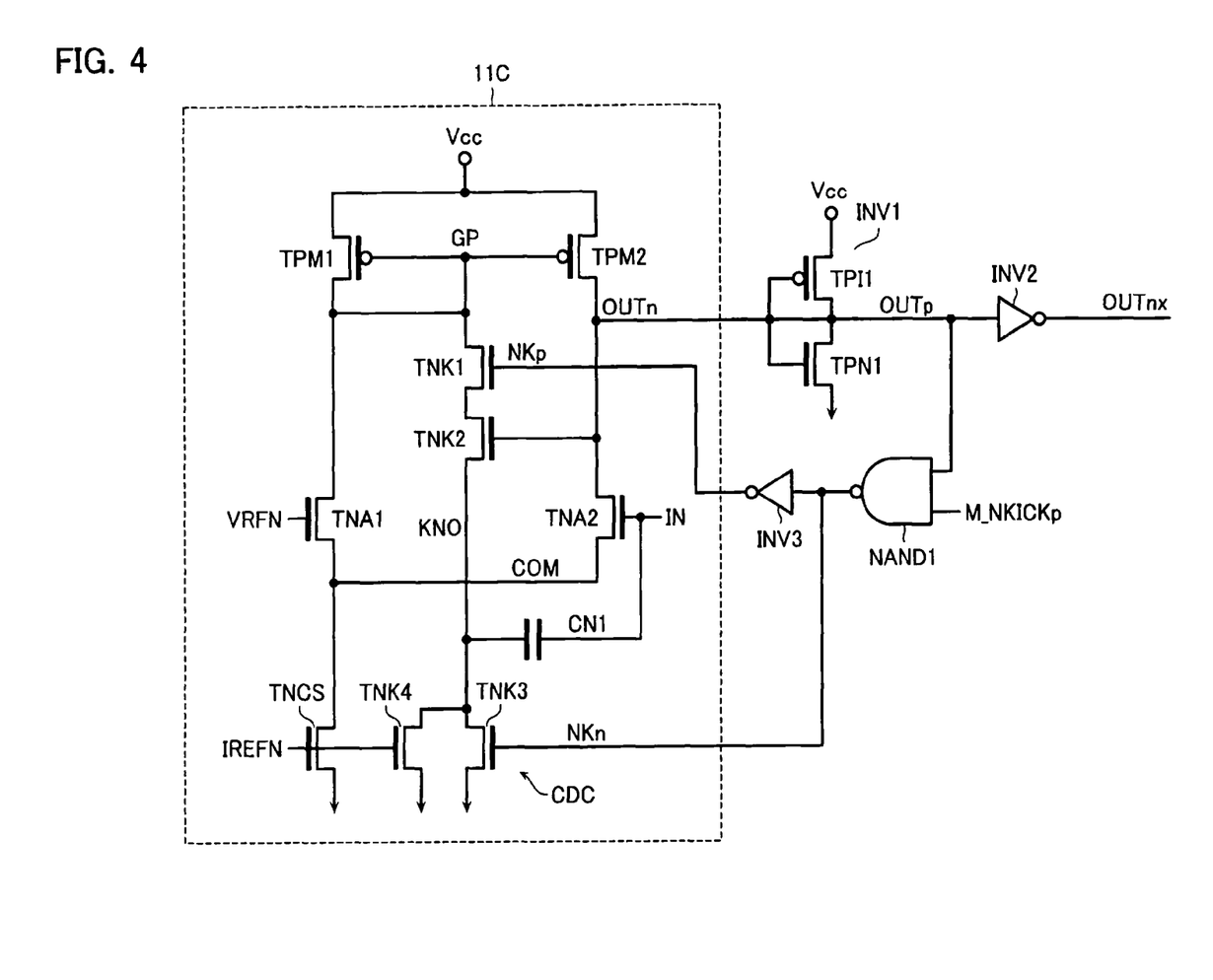
FIG. 4 is an equivalent circuit diagram of a semiconductor integrated circuit according to the second embodiment.

FIG. 4 illustrates an external input signal reception circuit including a current-mirror-type differential amplifier circuit according to the second embodiment. This external input signal reception circuit comprises a current-mirror-type differential amplifier circuit 11C, inverters INV1 and INV2, a NAND gate NAND1, and an inverter INV3.

Similarly to the current-mirror-type differential amplifier circuit 11A of the first embodiment, the current-mirror-type differential amplifier circuit 11C receives an input signal IN that is an external input signal input from outside as an input signal, and compares this input signal IN with a reference voltage VREF having a fixed value. The differentially-amplified signal as a result of the comparison is output to outside as an output signal OUTn.

In addition, the inverters INV1 and INV2 are identical to those in the first embodiment. The NAND gate NAND1 receives the output signal OUTp and a control signal M_CK1CKp as input signals provided thereto. The NAND gate NAND1 outputs an exclusive logical product signal of these two input signals.

The PMOS transistors TPM1 and TPM2, the NMOS transistors TNA1 and TNA2, and the NMOS transistor TNCS in the current-mirror-type differential amplifier 11C are identical to those in the first embodiment, hence a detailed description thereof is omitted below. As well as these configurations identical to those of the current-mirror-type differential amplifier 11A, the current-mirror-type differential amplifier 11C comprises NMOS transistors TNK1, TNK2, TNK3 and TNK4, and a capacitor CN1. These capacitors TNK1-4 and capacitor CN1 configure a charge/discharge accelerating circuit CDC for charging and discharging the node GP at high speed in response to switching of the input signal IN between "H" and "L".

The NMOS transistor TNK1 has its drain connected to the node GP, and has its gate supplied with an output signal NKp of the inverter INV3. This output signal NKp is generated by the inverter INV1, the NAND gate NAND1, and the inverter INV3, based on the output signal OUTn. The NMOS transistor TNK2 has its drain connected to the source of the NMOS transistor TNK1, and has its gate supplied with the output signal OUTn. The NMOS transistor TNK3 has its drain connected to the source of the NMOS transistor TNK2 (node KNO), has its gate supplied with an output signal NKn of the NAND gate NAND1, and has its source connected to a ground terminal. This output signal NKn is also generated based on the output signal OUTn.

The capacitor CN1 has its one end applied with the input signal IN, and its other end connected to the drain of the NMOS transistor TNK3 (node KNO). The capacitor CN1 functions to change the potential of the drain of the NMOS transistor TNK3 (node KNO) by capacitive coupling, based on the input signal IN. The capacitor CN1 is preferably a capacitor with a linear capacitance, but may also be configured by an N-channel MOS capacitor formed by short-circuiting the source and drain of an NMOS transistor.

The NMOS transistor TNK4 is connected so as to form a current path between the drain of the NMOS transistor TNK3 (node KNO) and the ground terminal. The NMOS transistor TNK4 has its gate applied with the control signal IREFN and thereby functions as a constant current circuit. This NMOS transistor TNK4 has a role of connecting the node KNO to the ground terminal by a high resistance. If the node KNO is substantively fixed at ground potential, then a capacitive coupling effect due to the capacitor CN1 becomes unobtainable. Having the above-mentioned NMOS transistor TNK4 connected allows a certain potential to be applied to the node KNO, whereby a capacitive coupling effect due to the capacitor CN1 can be obtained. The NMOS transistor TNK4 may be substituted by a resistance element having a high resistance.

Figure 8:
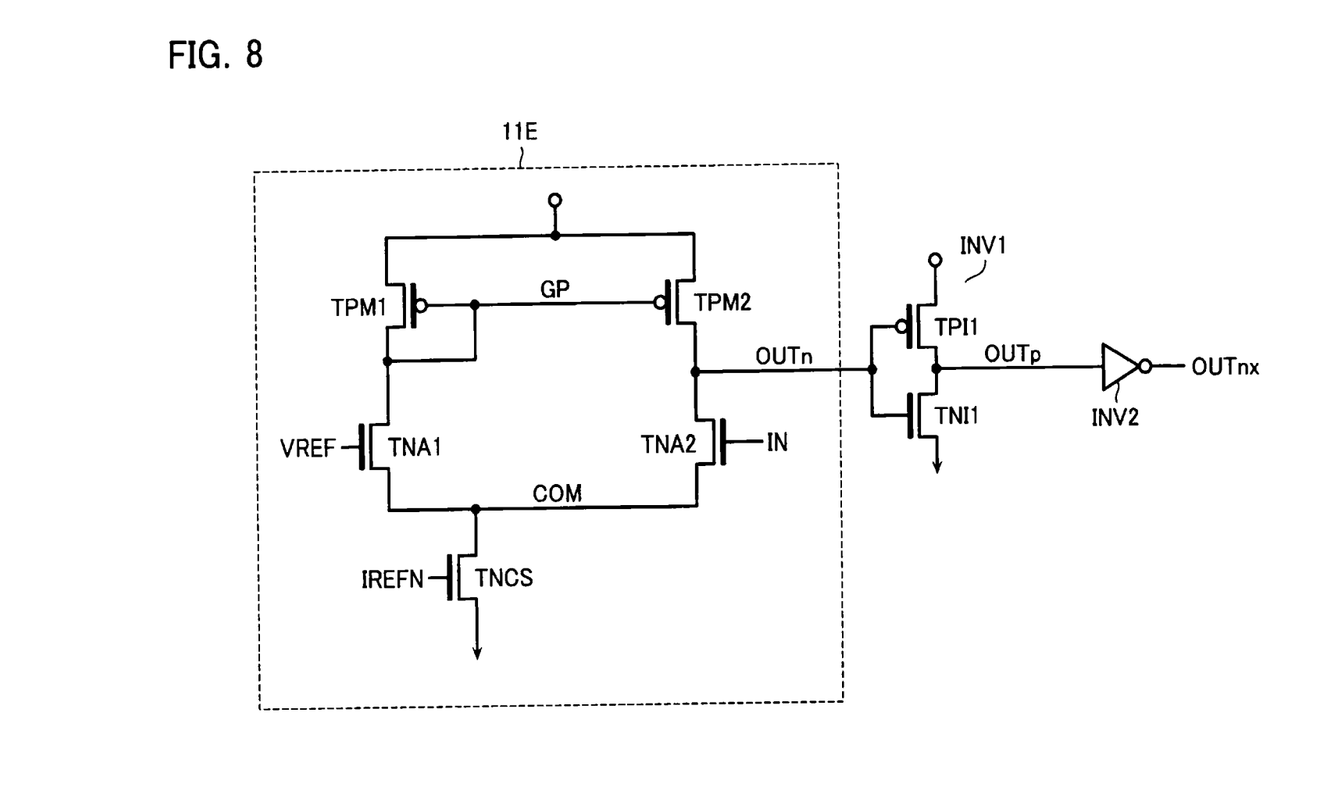
FIG. 8 is an equivalent circuit diagram of a comparative example of the embodiment.
Figure 9:
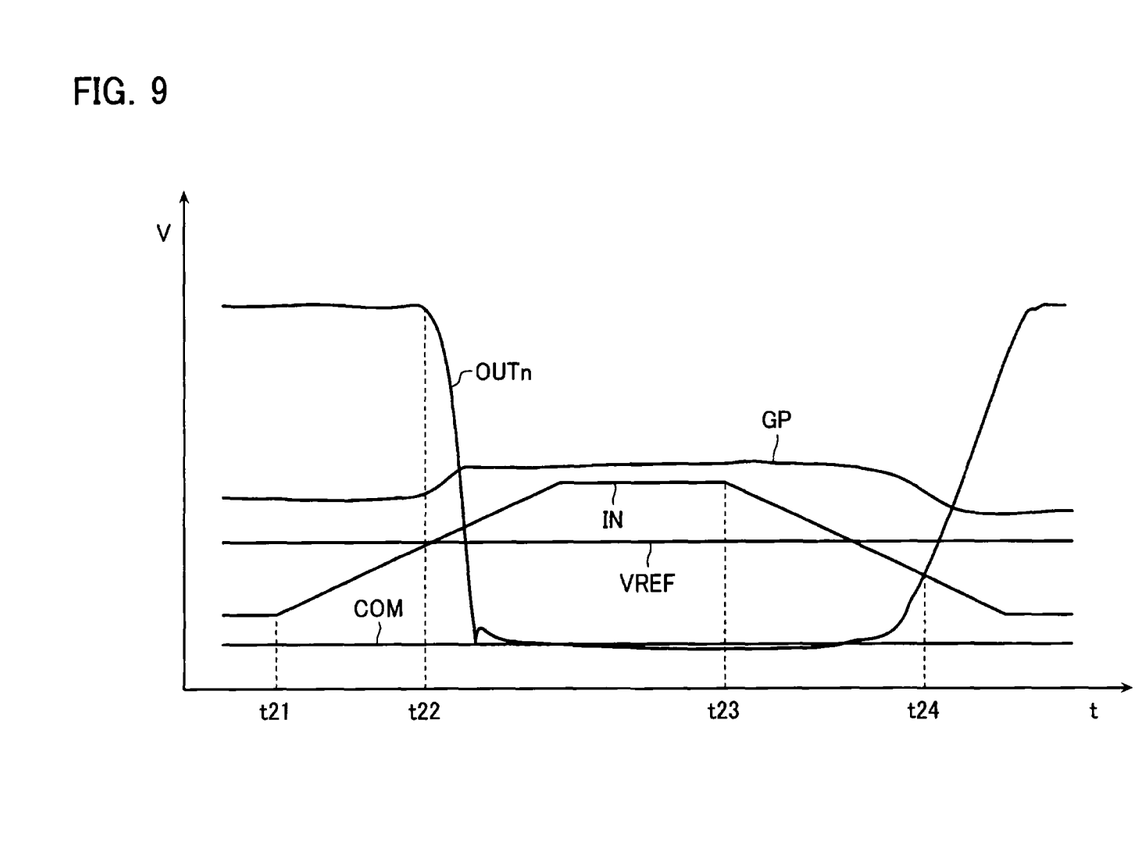
FIG. 9 is a graph showing an operation of the comparative example.

A comparative example of this second embodiment is shown in FIG. 8. This comparative example differs from the second embodiment (FIG. 4) in not having the above-mentioned charge/discharge accelerating circuit CDC and in also not having the control circuit (NAND gate NAND1 and inverter INV3) for control of the charge/discharge accelerating circuit CDC. As shown in FIG. 9, in the case of this comparative example, the transition time of the output signal OUTn differs between when the input signal IN rises from "L" to "H" and when the input signal IN falls from "H" to "L". The reason this occurs can be explained as follows. That is, when the input signal IN rises from "L" to "H", the node of the output signal OUTn is rapidly discharged via the NMOS transistor TNA2 configuring the differential pair. Hence, the potential of the output signal OUTn falls rapidly towards "L". On the other hand, when the input signal IN falls from "H" to "L", first, the potential of the node GP falls via the transistor TNA1 configuring the differential pair, and the current flowing in the PMOS transistor TPM2 increases. Then, the output node of the output signal OUTn is charged, hence signal transition speed when the output signal OUTn rises to "H" is slow in comparison to when the output signal OUTn falls to "L". The second embodiment solves difference of signal transition speed by the charge/discharge accelerating circuit CDC.

Figure 5:
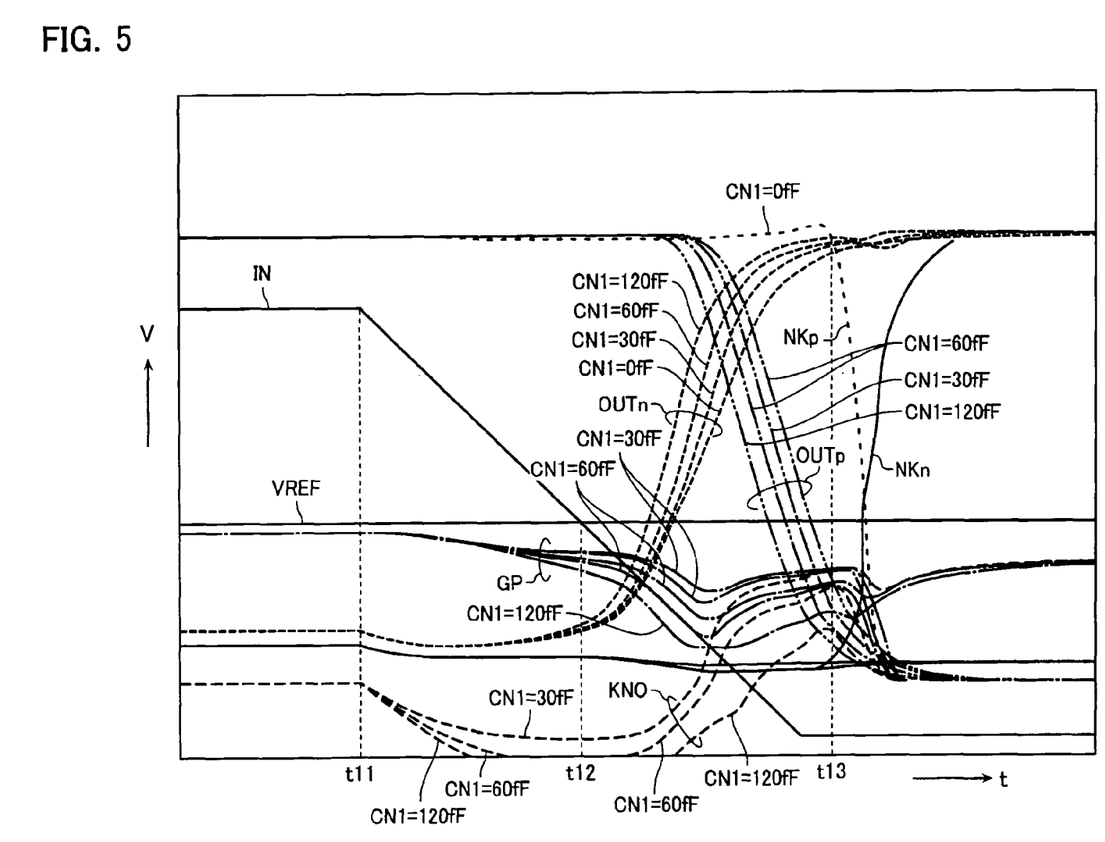
FIG. 5 is a graph that describes an operation of a semiconductor integrated circuit according to the second embodiment.

Next, operation of the semiconductor integrated circuit in this second embodiment is described with reference to the graph of FIG. 5. FIG. 5 shows operation when the input signal IN is switched from "H" to "L". Conversely, operation when the input signal IN is switched from "L" to "H" is omitted from FIG. 5. This is because, when the input signal IN is switched from "L" to "H", the charge/discharge accelerating circuit CDC does not operate, hence operation is entirely similar to operation of an ordinary current-mirror-type differential amplifier circuit. In addition, the graph of FIG. 5 shows variations in the various voltages when capacitance of the capacitor CN1 is changed to 0 (no capacitor CN1), 30 (fF), 60 (fF), and 120 (fF).

First, operation when the external input signal IN rises from "L" to "H" is described simply. As previously mentioned, operation in this case is entirely the same as operation of a conventional current-mirror-type differential amplifier circuit.

In this case, the output signal OUTn is "H" from the start, hence the output signal NKp is "L". The NMOS transistor TNK1 is thus in the non-conductive state (OFF), hence the charge/discharge accelerating circuit CDC does not function. At this time, the output signal NKn is in "H" state, hence the NMOS transistor TNK3 is in the conductive state (ON), whereby the node KNO is discharged to the ground potential. Then, after the input signal IN has fully risen to "H", the output signal OUTn attains "L", and, in addition, the output signal NKn attains "L" and the output signal NKp attains "H". Then, the NMOS transistor TNK3 attains the non-conductive state, and the node KNO becomes only connected to the ground terminal via the NMOS transistor TNK4 which is in a high-resistance state. In addition, the NMOS transistors TNK1 and TNK2 attain the conductive state (ON). This causes the node GP and the node KNO to be in a connected state. As a result, in the case of next shifting to where the input signal IN falls from "H" to "L", the node GP can be immediately pulled down to the ground potential.

Next, operation when the input signal IN falls from "H" to "L" is described with reference to FIG. 5. In this case, the NMOS transistors TNK1 and TNK2 are in the conductive state (ON), and the NMOS transistor TNK3 is in the non-conductive state (OFF). When the input signal IN starts a drop towards "L" at time t11, the voltage of the node KNO also starts a drop due to capacitive coupling of capacitor CN1 (as shown in FIG. 5, the degree of drop differs according to the capacitance of the capacitor CN1).

When the voltage value of the input signal IN falls to less than the voltage value of the reference voltage VREF at time t12, the voltage value of the output signal OUTn shifts from "L" to "H". At that time, the potential of the node KNO is pushed down to a negative voltage value due to capacitive coupling with the input signal IN, as shown in FIG. 5. As a result, the NMOS transistor TNK2 has a larger voltage applied between its gate and source and attains a state facilitating flow of a larger current. Therefore, the node GP is affected by the pushing-down of the potential of the node KNO to be discharged via the NMOS transistors TNK1 and TNK2. In this way, the potential of the node KNO being pulled down due to capacitive coupling of the capacitor CN1 causes current in the transistor TNK2 to increase, whereby discharge of the node GP is accelerated and transition of the output signal OUTnx is accelerated. This discharge causes the potential of the node GP and the potential of the node KPO to be substantially equal.

When the input signal IN reaches "L", and the output signal OUTn and output signal OUTp attain "H" and "L", respectively, the output signal NKp changes from "H" to "L", and, as a result, the NMOS transistor TNK1 is switched to the non-conductive state (OFF). Thus, operation of the charge/discharge accelerating circuit CDC is completed. In addition, the signal NKn attains "H" and the node KNO is discharged to the ground potential.

[Third Embodiment]

Figure 6:
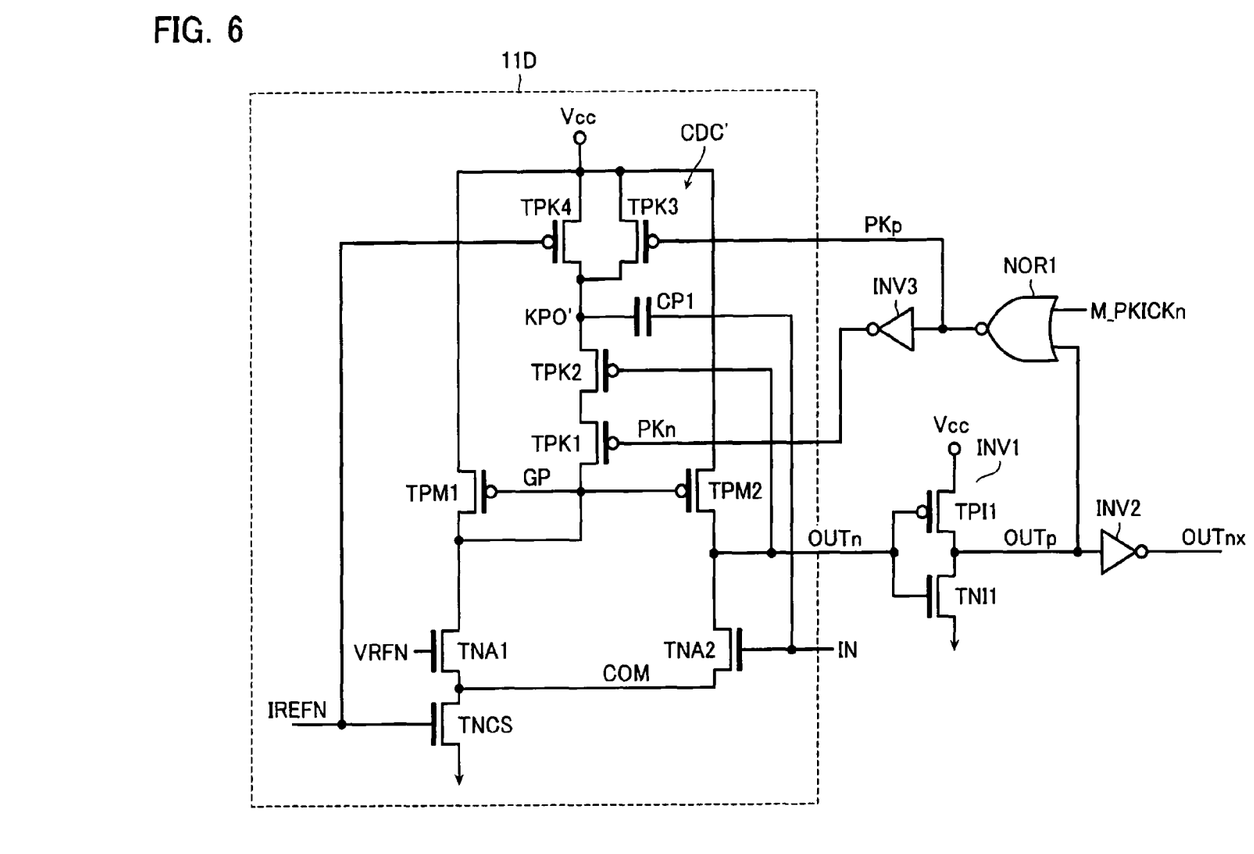
FIG. 6 is an equivalent circuit diagram of a semiconductor integrated circuit according to the third embodiment.

FIG. 6 illustrates an equivalent circuit of an external input signal reception circuit including a current-mirror-type differential amplifier circuit according to the third embodiment. This external input signal reception circuit comprises a current-mirror-type differential amplifier circuit 11D, inverters INV1 and INV2, a NOR gate NOR1, and an inverter INV3.

Similarly to the current-mirror-type differential amplifier circuits 11A-C of the previous embodiments, the current-mirror-type differential amplifier circuit 11D receives an input signal IN that is an external input signal input from outside as an input signal, and compares this input signal IN with a reference voltage VREF having a fixed value. The differentially-amplified signal as a result of the comparison is output to outside as an output signal OUTn.

In addition, the inverters INV1 and INV2 are identical to those in the first embodiment. The NOR gate NOR1 receives the output signal OUTp and a control signal M_CK1CKn as input signals provided thereto. The NOR gate NOR1 outputs an output signal PKp as an EX-OR signal of these two input signals. The inverter INV3 outputs an output signal PKn which is the inverted (reversed) signal of this output signal PKp.

The PMOS transistors TPM1 and TPM2, the NMOS transistors TNA1 and TNA2, and the NMOS transistor TNCS in the current-mirror-type differential amplifier 11D are identical to those in the previous embodiments, hence a detailed description thereof is omitted below. As well as these configurations identical to those of the current-mirror-type differential amplifiers 11A-C, the current-mirror-type differential amplifier 11D comprises PMOS transistors TPK1, TPK2, TPK3 and TPK4, and a capacitor CP1. These capacitors TPK1-4 and capacitor CP1 configure a charge/discharge accelerating circuit CDC' for charging and discharging the node GP at high speed in response to switching of the input signal IN between "H" and "L".

The charge/discharge accelerating circuit CDC in the second embodiment is configured to operate when the input signal IN falls from "H" to "L", thereby accelerating the discharge operation of the node GP and accelerating the transition of the output signal OUTnx.

In contrast, the charge/discharge accelerating circuit CDC' in this third embodiment is configured to operate when the input signal IN rises from "L" to "H", thereby accelerating the charge operation of the node GP to the power source voltage Vcc and accelerating the transition of the output signal OUTnx.

The PMOS transistor TPK1 has its drain connected to the node GP, and has its gate supplied with the output signal PKn. The PMOS transistor TPK2 has its drain connected to the source of the PMOS transistor TPK1, and has its gate supplied with the output signal OUTn. The PMOS transistor TPK3 has its drain connected to the source of the PMOS transistor TPK2, has its gate supplied with the output signal PKp, and has its source applied with the power source voltage Vcc. In addition, the PMOS transistor TPK4 is connected in parallel with this PMOS transistor TPK3. The PMOS transistor TPK4 has its gate applied with a control signal IREFN and functions as a constant current circuit.

In addition, the capacitor CP1 has its one end applied with the input signal IN, and has its other end connected to the source of the transistor TPK2 (node KPO'). The capacitor CP1 is preferably a capacitor having linear capacitance. Moreover, the capacitor CP1 may be configured by a P-type MOS capacitor formed by short-circuiting the source and drain of a PMOS transistor.

[Fourth Embodiment]

Figure 7:
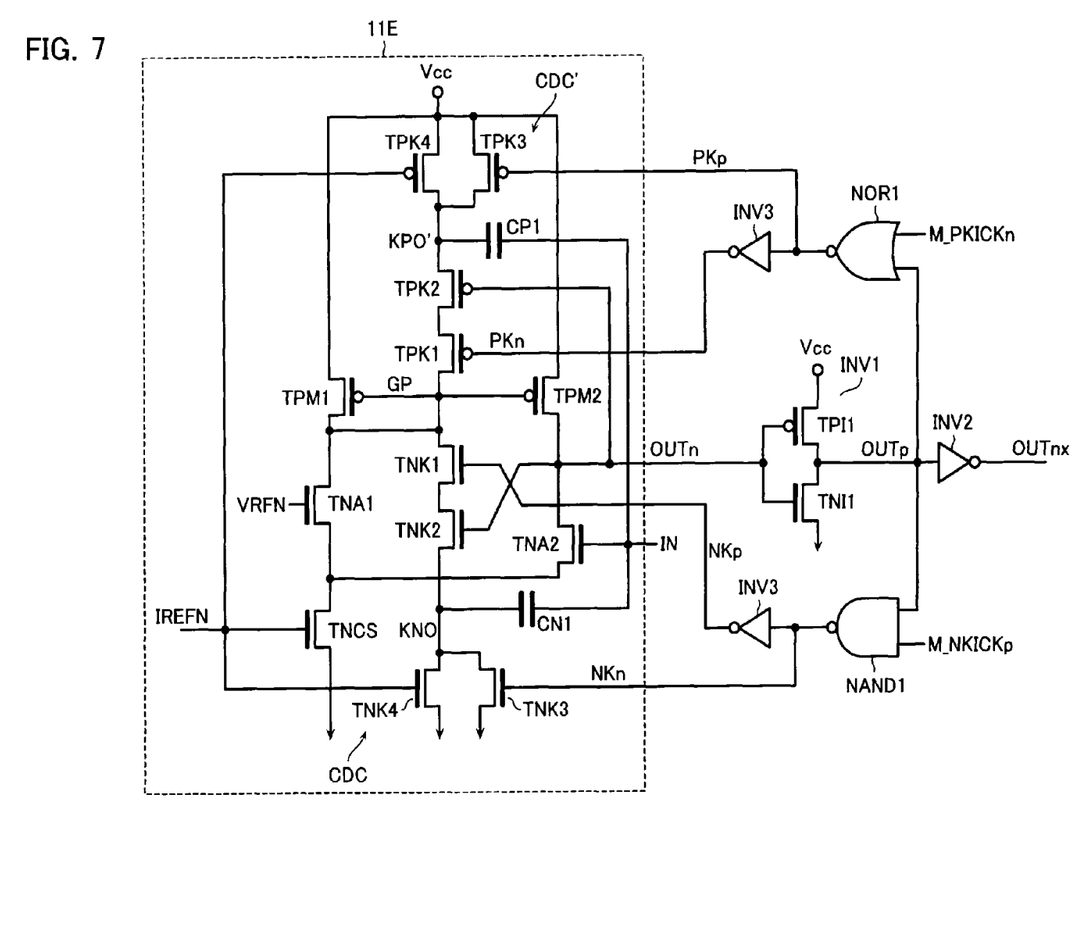
FIG. 7 is an equivalent circuit diagram of a semiconductor integrated circuit according to the fourth embodiment.

FIG. 7 illustrates an equivalent circuit of an external input signal reception circuit including a current-mirror-type differential amplifier circuit according to the fourth embodiment. This external input signal reception circuit combines the configurations of the current-mirror-type differential amplifier circuits according to the second and third embodiments, and thus includes both of the charge/discharge accelerating circuits CDC and CDC'.

The charge/discharge accelerating circuit CDC of the second embodiment is effective in the case where the transition time of the output signal when the input signal IN falls from "H" to "L" is later than the transition time of the output signal when the input signal IN rises from "L" to "H". Conversely, the charge/discharge accelerating circuit CDC' of the third embodiment is effective in the case where the transition time of the output signal when the input signal IN rises from "L" to "H" is later than the transition time of the output signal when the input signal IN falls from "H" to "L".

Thus, it is possible, and, in certain cases, preferable to provide one current-mirror-type differential amplifier circuit with a complete set of the charge/discharge accelerating circuits CDC and CDC' and circuits for controlling these charge/discharge accelerating circuits (the inverters INV1-3, NAND gate NANDI, and NOR gate NOR1 in FIGS. 4 and 6).

All that is required is to test for the difference between the transition time of the output signal when the input signal IN falls from "H" to "L" and the transition time of the output signal when the input signal IN rises from "L" to "H"; and then, according to the result of that test, to determine which of the charge/discharge accelerating circuits CDC and CDC' to operate, and to change a state of the control signals M_MK1CKp and M_PK1CKn accordingly.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions. For example, the above-described embodiments show an example where the current mirror circuit is formed by PMOS transistors and the differential pair is formed by NMOS transistors. However, conversely, the current mirror circuit may be formed by NMOS transistors and the differential pair may be formed by PMOS transistors.

What is claimed is:

1. A semiconductor integrated circuit comprising:
    a first transistor of a first conductivity type including a source connected to a first power supply node that supplies a first voltage, a gate, and a drain, the gate and drain being connected to a first node;
    a second transistor of the first conductivity type including a source connected to the first power supply node, a drain connected to a signal output node, and a gate connected to the first node;
    a third transistor of a second conductivity type including a drain connected to the drain of the first transistor, and a gate provided with either a first external input signal with a variable voltage level, or a second external input signal with a fixed level;
    a fourth transistor of the second conductivity type including a drain connected to the drain of the second transistor, a source connected to a source of the third transistor, and a gate provided with either the first external input signal or the second external input signal, the signal provided to the gate of the fourth transistor being a signal other than a signal provided to the gate of the third transistor;
    a first constant current source circuit including one end connected to a second node as sources of the third and fourth transistors, and the other end connected to a second power supply node that supplies a second voltage different from the first voltage; and
    a charge/discharge accelerating circuit connected to form a current path between the first node and the second power supply node, and configured to connect the first node and the second power supply node to accelerate charging or discharging of the first node when the first external input signal is switched from a first state to a second state,
    the charge/discharge accelerating circuit including:
    a fifth transistor of the first conductivity type, the fifth transistor being formed in the current path, and a gate thereof being connected to the signal output node;
    a capacitor having one end connected to a source of the fifth transistor and the other end provided with the first external input signal; and
    a sixth transistor of the second conductivity type connected to form a current path between a source of the fifth transistor and the second power supply node and having a gate provided with a first control signal, the first control signal being generated based on an output signal from the signal output node.

2. The semiconductor integrated circuit according to claim 1, further comprising a second constant current source circuit connected to form a current path between a drain of the sixth transistor and the second power supply node.

3. The semiconductor integrated circuit according to claim 1, further comprising a seventh transistor of the second conductivity type, the seventh transistor being formed in the current path between the source of the fifth transistor and the second power supply node, and having a gate provided with a second control signal generated based on the output signal from the signal output node.

4. The semiconductor integrated circuit according to claim 3, further comprising a second constant current source circuit connected to form a current path between a drain of the sixth transistor and the second power supply node.

5. A semiconductor integrated circuit comprising:
- a first transistor of a first conductivity type including a source connected to a first power supply node that supplies a first voltage, a gate, and a drain, the gate and drain being connected to a first node;
- a second transistor of the first conductivity type including a source connected to the first power supply node, a drain connected to a signal output node, and a gate connected to the first node;
- a third transistor of a second conductivity type including a drain connected to the drain of the first transistor, and a gate provided with either a first external input signal with a variable voltage level, or a second external input signal with a fixed level;
- a fourth transistor of the second conductivity type including a drain connected to the drain of the second transistor, a source connected to a source of the third transistor, and a gate provided with either the first external input signal or the second external input signal, the signal provided to the gate of the fourth transistor being a signal other than a signal provided to the gate of the third transistor;
- a first constant current source circuit including one end connected to a second node as sources of the third and fourth transistors, and the other end connected to a second power supply node that supplies a second voltage different from the first voltage; and
- a charge/discharge accelerating circuit connected to form a current path between the first node and the second power supply node, and configured to connect the first node and the second power supply node to accelerate charging or discharging of the first node when the first external input signal is switched from a first state to a second state,
the charge/discharge accelerating circuit including:
- a fifth transistor of the first conductivity type, the fifth transistor being formed in the current path, and a gate thereof being connected to the signal output node;
- a capacitor having one end connected to a source of the fifth transistor and the other end provided with the first external input signal; and
- a sixth transistor of the first conductivity type connected to form a current path between a source of the fifth transistor and the first power supply node and having a gate provided with a first control signal, the first control signal being generated based on an output signal from the signal output node.

6. The semiconductor integrated circuit according to claim 5, further comprising a second constant current source circuit connected to form a current path between a drain of the sixth transistor and the second power supply node.

7. The semiconductor integrated circuit according to claim 5, further comprising a seventh transistor of the second conductivity type, the seventh transistor being formed in the current path between the source of the fifth transistor and the first power supply node, and having a gate provided with a second control signal generated based on the output signal from the signal outputs node.

8. The semiconductor integrated circuit according to claim 7, further comprising a second constant current source circuit connected to form a current path between a drain of the sixth transistor and the second power supply node.

9. The semiconductor integrated circuit according to claim 5, wherein the charge/discharge accelerating circuit causes the first node to be disconnected from the first power supply node when the first external input signal is switched from a second state to a first state.

* * * * *